United States Patent [19]

Yee et al.

[11] Patent Number: 5,723,896
[45] Date of Patent: Mar. 3, 1998

[54] INTEGRATED CIRCUIT STRUCTURE WITH VERTICAL ISOLATION FROM SINGLE CRYSTAL SUBSTRATE COMPRISING ISOLATION LAYER FORMED BY IMPLANTATION AND ANNEALING OF NOBLE GAS ATOMS IN SUBSTRATE

[75] Inventors: Abraham Yee, Santa Clara; Sheldon Aronowitz, San Jose, both of Calif.

[73] Assignee: LSI Logic Corporation, Milpitas, Calif.

[21] Appl. No.: 771,372

[22] Filed: Dec. 16, 1996

Related U.S. Application Data

[60] Continuation of Ser. No. 461,413, Jun. 5, 1995, abandoned, which is a division of Ser. No. 198,911, Feb. 17, 1994, Pat. No. 5,508,211.

[51] Int. Cl.$^6$ .................... H01L 29/00; H01L 27/01; H01L 27/12; H01L 31/0392
[52] U.S. Cl. .................... 257/499; 257/522; 257/347
[58] Field of Search .................... 257/347, 522, 257/499

[56] References Cited

U.S. PATENT DOCUMENTS

| | | | |
|---|---|---|---|
| 3,622,382 | 11/1971 | Brack et al. | 117/201 |
| 3,663,308 | 5/1972 | Davey | 148/1.5 |
| 3,865,633 | 2/1975 | Shannon et al. | 257/523 |
| 3,897,273 | 7/1975 | Marsh et al. | 257/522 |
| 4,053,925 | 10/1977 | Burr et al. | 357/64 |
| 5,049,521 | 9/1991 | Belanger et al. | 437/62 |
| 5,125,007 | 6/1992 | Yamaguchi et al. | 257/347 |
| 5,198,371 | 3/1993 | Li | 437/11 |
| 5,334,283 | 8/1994 | Parikh et al. | 156/654 |
| 5,372,952 | 12/1994 | Aronowitz et al. | 437/24 |

OTHER PUBLICATIONS

Wittmer, M., et al., "Epitaxial Regrowth of Ne– and Kr–Implanted Amorphous Silicon", *J. Appl. Phys.*, vol. 49, No. 10, Oct. 1978, pp. 5207–5212.

Aronowitz, Sheldon, "Quantum–Chemical Modeling of Boron and Noble Gas Dopants in Silicon", *J. Appl. Phys.*, vol. 54, No. 7, Jul. 1983, pp. 3930–3934.

Cullis, A.G., "Comparative Study of Annealed Neon–, and Krypton–Ion Implantation Damage in Silicon", *J. Appl. Phys.*, vol. 49, No. 10, Oct. 1978, pp. 5188–5198.

Revesz, P., et al., "Epitaxial Regrowth of Ar–Implanted Amorphous Silicon", *J. Appl. Phys.*, vol. 49, No. 10, Oct. 1978, pp. 5199–5206.

*Primary Examiner*—Stephen Meier
*Attorney, Agent, or Firm*—John P. Taylor

[57] ABSTRACT

An integrated circuit structure vertically isolated electrically from the underlying substrate is formed in/on a single crystal semiconductor substrate, such as a silicon semiconductor wafer, by first implanting the substrate with a sufficient dosage of noble gas atoms to inhibit subsequent recrystallization of the semiconductor lattice in the implanted region during subsequent annealing, resulting in the formation of an isolation layer comprising implanted noble gas atoms enmeshed with semiconductor atoms in the substrate which has sufficient resistivity to act as an isolation layer. The preferred noble gases used to form such isolation layers are neon, argon, krypton, and xenon. When neon atoms are implanted, the minimum dosage should be at least about $6 \times 10^{15}$ neon atoms/cm$^2$ to inhibit subsequent recrystallization of the silicon substrate. When argon atoms are implanted, the minimum dosage should be at least about $2 \times 10^{15}$ argon atoms/cm$^2$. When krypton is implanted, the minimum dosage should be at least about $6 \times 10^{14}$ krypton atoms/cm$^2$. The energy used for the implant should be sufficient to provide an average implant depth sufficient to form, after annealing, the noble gas isolation layer at a depth of at least about 0.5 microns from the surface.

12 Claims, 2 Drawing Sheets

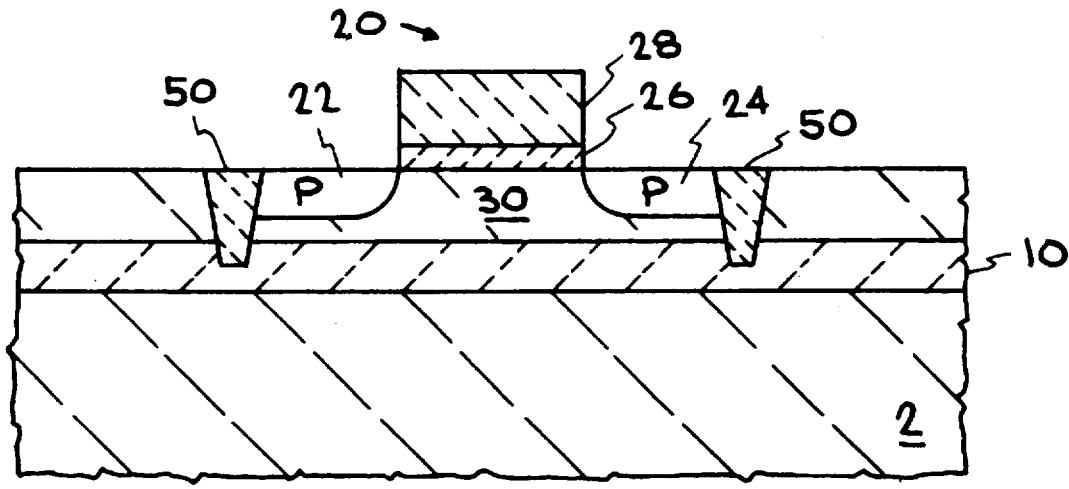

FIG. 5

```
IMPLANTING NOBLE GAS ATOMS INTO A
SINGLE CRYSTAL SUBSTRATE AT A
DOSAGE LEVEL SUFFICIENT TO INHIBIT
SUBSEQUENT RECRYSTALLIZATION OF
THE REGION OF THE SUBSTRATE
CONTAINING THE NOBLE GAS ATOMS
```

```
ANNEALING THE IMPLANTED SUBSTRATE
TO FORM AN ISOLATION LAYER OF
NOBLE GAS ATOMS BENEATH THE
SUBSTRATE SURFACE
```

```
FORMING AN INTEGRATED CIRCUIT
STRUCTURE IN THE SUBSTRATE ABOVE
THE ISOLATION LAYER OF NOBLE
GAS ATOMS
```

FIG. 6 dose
INTEGRATED CIRCUIT STRUCTURE WITH VERTICAL ISOLATION FROM SINGLE CRYSTAL SUBSTRATE COMPRISING ISOLATION LAYER FORMED BY IMPLANTATION AND ANNEALING OF NOBLE GAS ATOMS IN SUBSTRATE This application is a continuation of application Ser. No. 08/461,413, filed Jun. 5, 1995 now abandoned as a division of application Ser. No. 08/198,911, filed Feb. 17, 1994 now U.S. Pat. No. 5,508,211.

BACKGROUND OF THE INVENTION

1. Field of the Invention

This invention relates to an integrated circuit structure isolated from portions of a single crystal substrate beneath the integrated circuit structure by an isolation layer of noble gas atoms in the substrate. More particularly, this invention relates to an integrated circuit structure isolated from portions of a single crystal substrate beneath the integrated circuit structure by an isolation layer of noble gas atoms implanted beneath the surface of the substrate and then annealed to form the isolation layer and a method of making such an isolation layer.

2. Description of the Related Art

In the formation of a plurality of integrated circuit structures on/in a common single crystal substrate, e.g., a semiconductor wafer, each integrated circuit structure, e.g., active device, is electrically isolated from other such devices formed on/in the same substrate. Such electrical isolation usually includes lateral isolation which conventionally comprises field oxide or oxide-filled trenches. However, in at least some circumstances, it is also important to provide vertical isolation of the integrated circuit structure from the bulk of the substrate beneath the integrated circuit structure, to avoid coupling through the bulk of the substrate to other devices formed in/on the substrate, to avoid deep punch-through, e.g., by alpha particles, for soft-error reduction, for depletion containment, and to reduce the defect density.

Such vertical isolation can be formed by forming an oxide layer beneath the surface of a substrate by implanting oxygen atoms and then annealing the implanted oxygen atoms to form the desired isolation. Such a structure is usually referred to as silicon-on-insulator isolation. However, while the formation of such an oxide isolation layer beneath the surface of the substrate can result in the reduction or elimination of the aforesaid problems, it is not without problems of its own, including the formation of an electrically floating substrate on/in which the integrated circuit structure will be constructed. This is not desirable because floating substrates are susceptible to bipolar breakdown, reduced noise immunity, and uncertain transistor performance.

Formation of an oxide isolation layer beneath the surface of a substrate is undesirable because the oxygen implant would have to be performed at a high temperature of about 600° C. at very high doses, e.g., $10^{18}$ atoms/cm$^2$. No resist would protect it, so the whole wafer would need to be implanted. At the present time there are only a limited number of implanters in existence capable of carrying out such an oxygen implant.

In previous studies of implant dosages of noble gases such as neon, argon, and krypton, into single crystal silicon, the blocking or prevention of epitaxial regrowth of the damaged silicon after implantation by some threshold dosage concentration of the noble gas atoms has been discussed. Cullis, Seidel, and Meek, in an article entitled "Comparative Study of Annealed Neon-, Argon-, and Krypton-Ion Implantation Damage in Silicon", published in the Journal of Applied Physics, 49 (10), October 1978, at pages 5188-5198, discussed implantation damage and noted that for dosages of $6\times10^{15}$ Ne$^+$atoms per cm$^2$, $2\times10^{15}$ Ar$^+$atoms per cm$^2$, or $6\times10^{14}$ Kr$^+$atoms per cm$^2$, each gave a continuous disordered zone from the Si surface to the end of the range after initial implantation, while polycrystalline layers were formed upon annealing at 1100° C. for 30 minutes.

Revesz, Wittmer, Roth, and Mayer, in an article entitled "Epitaxial Regrowth of Ar-Implanted Amorphous Silicon" published in the Journal of Applied Physics, 49 (10), October 1978, at pages 5199-5206, report on the epitaxial regrowth of silicon after implantation of Argon atoms at dosage levels of $2\times10^{15}$ Ar atoms/cm$^2$ and $6\times10^{15}$ AR atoms/cm$^2$. They state that initially, the regrowth rate is rather high, but slows down with longer anneals and stops completely after a certain annealing time. They stated that from these facts one might readily conclude that the regrowth is governed by the Ar concentration and that the regrowth stops completely if this concentration reaches a certain amount at the amorphous-crystalline interface.

The same authors (Wittmer, Roth, Revesz, and Mayer) also published a paper entitled "Epitaxial Regrowth of Ne- and Kr-Implanted Amorphous Silicon" in the Journal of Applied Physics, 49 (10), October 1978, at pages 5207-5212. In this paper they discussed the effect of the presence of such noble gas atoms on bubble growth in the substrate and speculated that epitaxial regrowth can be blocked for the Ne- and Kr-implanted case, as in the Ar-implanted silicon, if the concentration of the implanted specie exceeds a certain critical value.

Aronowitz, in a paper entitled "Quantum-Chemical Modeling of Boron and Noble Gas Dopants in Silicon", published in the Journal of Applied Physics, 54 (7), July 1983, at pages 3930-3934, noted the earlier papers and then calculated that the implanted noble gas atoms would be energetically less stably constrained within the silicon lattice than if free, i.e., not within a lattice structure.

While the presence of noble gas atoms in a silicon substrate is, therefore, not unknown, the previous studies of such centered about the presence of such noble gas atoms in connection with riopant implants, or the presence of such noble gases in gettering, ion etching, and sputtering processes. That is, the presence of such noble gas atoms in the silicon substrate was usually ancillary to some other process or reaction and was, therefore studied either as a tolerated impurity or at least as present or functioning as a supplement to another substance, e.g., a dopant, also present in the substrate.

SUMMARY OF THE INVENTION

Quite surprisingly, therefore, we have discovered that an integrated circuit structure vertically isolated electrically from the underlying substrate can be formed in/on a single crystal substrate, such as a silicon semiconductor wafer, by first implanting the substrate with a sufficient dosage of noble gas atoms to inhibit subsequent recrystallization during annealing to form an isolation layer of said noble gas atoms in the substrate which has sufficient resistivity to act as an isolation layer. The preferred noble gases used to form such isolation layers are neon, argon, and krypton. When neon atoms are implanted, the minimum dosage should be at least about $6\times10^{15}$ neon atoms/cm$^2$ to inhibit subsequent recrystallization of the silicon substrate. When argon atoms are implanted, the minimum dosage should be at least about $2 \times 10^{13}$ argon atoms/cm$^2$. When krypton is implanted, the minimum dosage should be at least about $6 \times 10^{14}$ krypton atoms/cm$^2$. The energy used for the implant should be sufficient to provide an average implant depth sufficient to form, after annealing, the noble gas isolation layer at a depth of at least about 0.5 microns from the surface.

BRIEF DESCRIPTION OF THE DRAWINGS

FIG. 5 is a fragmentary cross-sectional view showing an oxide-filled trench formed adjacent the integrated circuit structure shown in FIG. 3 to provide, in cooperation with the noble gas atom isolation layer, vertical and lateral electrical isolation of the illustrated integrated circuit structure from other portions of the integrated circuit structure formed on the substrate.

FIG. 6 is a flow sheet illustrating the process of the invention.

DETAILED DESCRIPTION OF THE INVENTION

Figure 1:
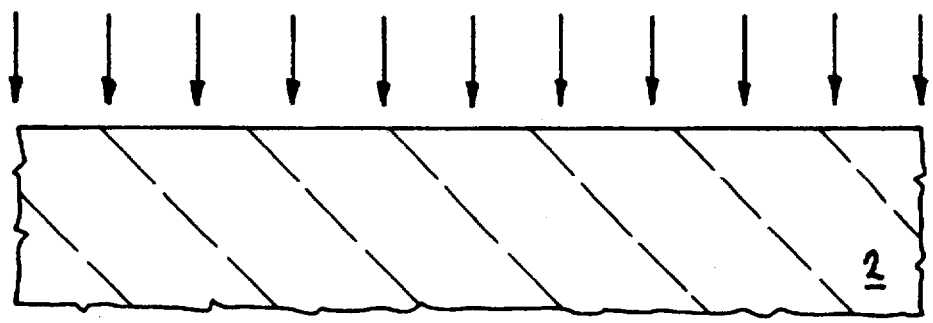
FIG. 1 is a fragmentary cross-sectional view of a single crystal substrate being implanted with noble gas atoms.

The invention comprises an integrated circuit structure formed in a single crystal semiconductor substrate and separated from a portion of the substrate by a non-oxide isolation layer formed beneath the integrated circuit structure. The non-oxide isolation layer is formed by implanting noble gas atoms into the substrate at a dosage level sufficient to inhibit subsequent recrystallization of the semiconductor material upon annealing. The resulting layer of noble gas atoms and semiconductor atoms has a resistance high enough to provide electrical isolation of the integrated circuit formed thereover from the remainder of the semiconductor substrate beneath the isolation layer, particularly when integrated circuit structures capable of operating at 3 volts or less are constructed over the isolation layer.

By use of the term "noble gases" as implant atoms for use herein in forming the desired isolation layer is meant neon, argon, krypton, and xenon. While helium is also a noble gas, it has been omitted from the definition because it is too light to cause sufficient damage at a reasonable dose and the dose needed to create permanent damage would be too high; and radon has been omitted because of its radioactivity.

Since the purpose of implanting the substrate with these noble gas atoms, followed by annealing, is to form the desired isolation layer in the semiconductor substrate, it is important that the annealing not result in subsequent recrystallization of the damaged single crystal semiconductor layer, with uniform diffusion of the noble gas atoms throughout the substrate, or at least over the entire implanted volume. By use of the phrase "inhibit subsequent recrystallization" is meant that the damaged portion of the single crystal semiconductor substrate, i.e., the central portion of the region of the substrate containing the implanted noble gas atoms, does not recrystallize as single crystal material.

Rather the annealing should result in concentration of the implanted noble gas atoms into a concentrated region of the substrate to form the desired isolation layer. To do so, it is important that the implant dosage of the noble gas atoms be above a threshold level to provide sufficient damage or disruption of the crystal lattice so that subsequent annealing will not repair such damage, i.e., will not result in recrystallization of the disrupted or damaged area. This threshold dosage will vary with the respective noble gas atoms, because of the differences in mass between the noble gas atoms.

While we do not wish to be bound by any theories with regard to the formation of the isolation layer, the implanted noble gas atoms tend to migrate to the area or region of least crystallinity or order. Therefore, the anneal appear to serve the dual purpose of recrystallizing the region above the isolation layer as well as causing the migration or further concentration of the implanted noble gas atoms into the isolation region where recrystallization is not occurring. Thus, both the implant and anneal steps appear to play a role in the formation of the desired isolation layer where the implanted noble gas atoms are enmeshed with semiconductor atoms, e.g., silicon atoms.

When the noble gas atoms consist of neon atoms, the minimum dosage should be at least about $6 \times 10^{15}$ neon atoms/cm$^2$ at an energy level of at least 0.75 meV to inhibit recrystallization of the silicon substrate. When argon atoms are implanted, the minimum dosage should be at least about $2 \times 10^{13}$ argon atoms/cm$^2$ at an energy level of at least 1.5 meV. When krypton atoms are implanted, the minimum dosage should be at least about $6 \times 10^{14}$ krypton atoms/cm$^2$ at an energy level of at least about 3 meV.

It is also important that the isolation layer of noble gas atoms be formed beneath the surface of the semiconductor substrate at a sufficient depth to permit the layer of semiconductor above the isolation layer to be of sufficient quality and crystallinity to permit the formation of the desired integrated circuit structure. To achieve this end, it is necessary to implant the noble gas atoms at a sufficient minimum energy level.

It will be understood that the use of the term "isolation layer" is intended to define a region in the semiconductor substrate where the noble gas atoms are enmeshed with the semiconductor atoms, e.g., silicon atoms, and the crystallinity of the semiconductor lattice has been sufficiently disrupted by the implant so that recrystallization will not occur during the subsequent anneal.

The minimum depth, beneath the substrate surface, of the isolation layer to be formed in the single crystal substrate after annealing should range from at least about 0.3 microns (3,000 Angstroms), to about 2 microns (20,000 Angstroms), and preferably from about 0.5 microns to 1 micron, as measured from the surface down to the uppermost portion of the layer. This will ensure the provision of adequate depth of the substrate above the isolation layer to permit formation of the desired integrated circuit structures on/in the substrate. However, it is also important that the isolation layer not be so deep in the substrate as to defeat the purpose of the isolation layer, i.e., to isolate the integrated circuit structure formed thereover from the bulk of the substrate. Therefore, the depth of the isolation layer, i.e., the distance from the surface to the uppermost portion of the isolation layer, should not exceed about 2 microns, preferably not exceed about 1.5 microns, and most preferably not exceed about 1 micron.

In view of the difference in mass of the neon, argon, krypton, and xenon atoms, the minimum energy implant level needed to provide the above discussed depth of the resulting isolation layer after annealing will vary with each of the noble gases. For neon, the implant energy to achieve the desired implant depth should range from about 0.75 MeV to about 1.25 MeV, preferably about 1 MeV. For argon, the implant energy should range from about 1.5 MeV to about 2.5 MeV, preferably about 2 MeV. For krypton, the implant energy should range from about 3 MeV to about 5 MeV, preferably about 4 MeV. The xenon implant energy should exceed the energy used for the krypton implant.

After the implantation, the implanted substrate should be annealed to form the desired isolation layer in the substrate and to recrystallize the portion of the substrate above the isolation layer. This implantation may be carried out at any conventional annealing temperature used after implantation for the particular substrate material. For example, for single crystal silicon substrate material, the substrate may be annealed at a temperature within a range of from 900° C. to 1150° C. for a period of from about 1 hour to about 10 hours. The substrate may also be annealed using a rapid thermal annealing technique wherein the substrate is rapidly brought up to the annealing temperature, e.g., within less than 60 seconds, and then held at this temperature for a period of from about 0.5-3 minutes.

Figure 2:
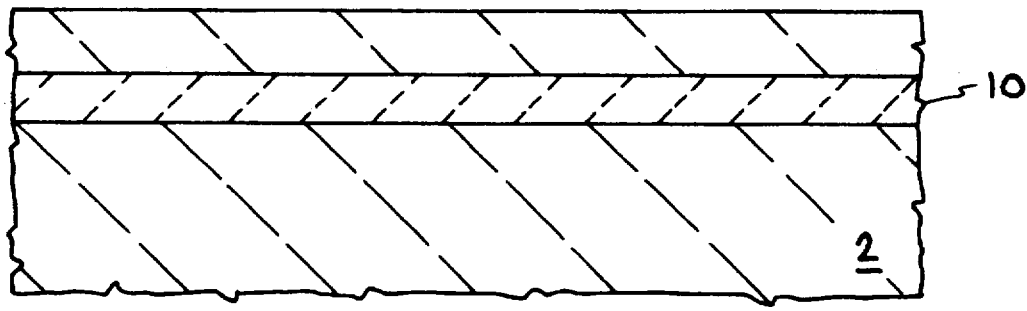
FIG. 2 is a fragmentary cross-sectional view of the implanted single crystal substrate of FIG. 1 after annealing to form the desired noble gas atom isolation layer beneath the surface of the substrate.

Referring now to the drawings, FIG. 1 shows a single crystal substrate 2, such as a single crystal silicon semiconductor wafer, being implanted with noble gas atoms from a source of such atoms such as an implanter normally used to implant dopants such as boron, phosphorus, or arsenic into a substrate as is well known to those skilled in the art. After the implantation, the substrate is annealed as described to form the desired isolation layer 10 comprising the implanted noble gas atoms, as shown in FIG. 2. formation of isolation layer 10 in substrate 2, an integrated circuit structure such as, for example, the MOS structure 20 shown in FIG. 3 can be formed in substrate 2 comprising a source region 22 and a drain region 24 formed in substrate 2, gate oxide 26 and a silicon gate electrode 28 formed over channel portion 30 in substrate 2 between source region 22 and drain region 24.

When isolation layer 10 is present in substrate 2, for example, an ionized path formed in substrate 2 and extending below isolation layer 10, such as formed by impact with radiation such as an alpha particle, as shown at dotted line 100 in FIG. 3, will not result in an ionized charge being collected by the sensitive drain region 24.

Figure 3:
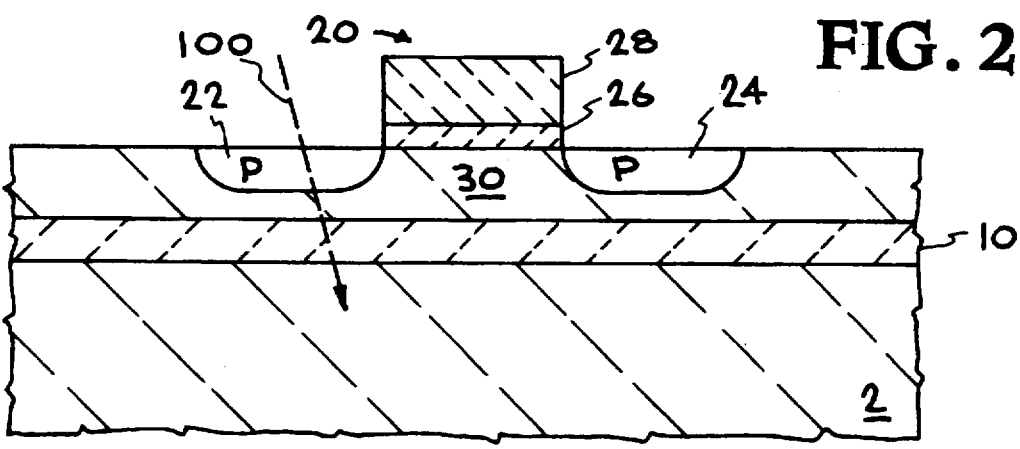
FIG. 3 is a fragmentary cross-sectional view of an active device comprising a portion of an integrated circuit structure shown formed in the substrate over the noble gas atom isolation layer shown in FIG. 2.

While isolation layer 10 in FIG. 3 provides isolation of the bulk of substrate 2 from MOS device 20, it is conventional to provide lateral dielectric isolation of such an active device 20 from adjacent portions of the integrated circuit structure as well. Therefore, as shown in FIG. 4, dielectric material such as field oxide (e.g., silicon oxide) portions 40 may be grown in the surface of substrate 2 which preferably extend down to isolation layer 10 to, therefore, provide complete electrical isolation of a device such as device 20 from other portions of substrate 2, including other integrated circuit structures formed in such other portions.

Similarly, as shown in FIG. 5, lateral electrical isolation of active device 20 may also be achieved by forming isolation trench 50 extending down from the surface of substrate 2, preferably to intersect isolation layer 10. Isolation trench 50 may be filled with oxide, e.g., silicon oxide, or other dielectric insulation material, e.g., silicon nitride, or lined with oxide or other dielectric insulation material and then refilled with material such as polysilicon.

Figure 4:
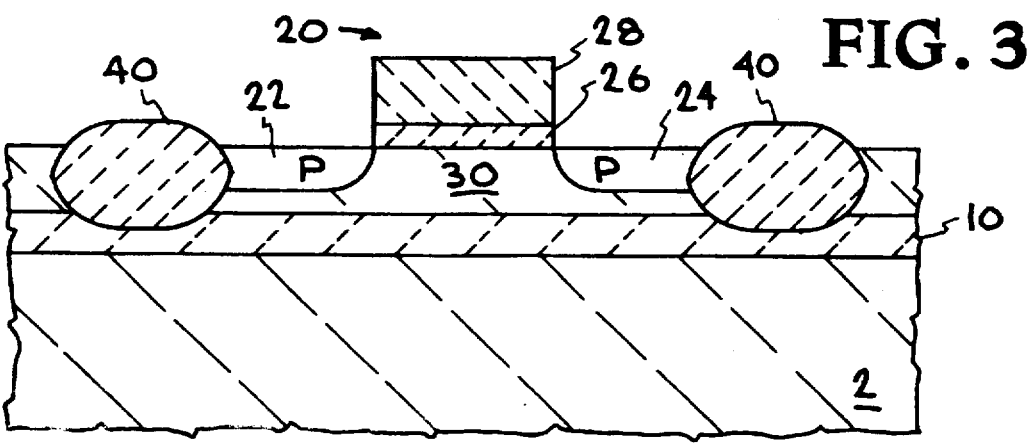
FIG. 4 is a fragmentary cross-sectional view showing field oxide grown adjacent the integrated circuit structure shown in FIG. 3 to provide, in cooperation with the noble gas atom isolation layer, vertical and lateral electrical isolation of the illustrated integrated circuit structure from other portions of the integrated circuit structure formed on the substrate.

While a PMOS or p-channel device is shown in FIGS. 3-5, by way of illustration, it will be readily appreciated that other devices, such as NMOS or bipolar devices may be formed in the substrate and will also be isolated from other regions of the substrate by isolation layer 10. Thus, the invention provides an integrated circuit structure formed in a single crystal substrate and separated from portions of the substrate beneath the integrated circuit structure by an isolation layer of noble gas atoms formed beneath the surface of the substrate. When combined with lateral isolation such as field oxide or isolation trenches formed in the substrate and extending down from the surface of the substrate, an integrated circuit structure may be both vertical and laterally isolated electrically from other structures formed in the same substrate.

Having thus described the invention what is claimed is:

1. An integrated circuit structure in a single crystal silicon substrate electrically isolated from other portions of said silicon substrate by a buried non-oxide isolation region formed in said silicon substrate beneath said integrated circuit structure and spaced from the surface of said silicon substrate above said buried non-oxide isolation region, said isolation region comprising an implant-damaged region of said silicon substrate containing implanted atoms of a noble gas selected from the group consisting of neon, implanted in said substrate at a dosage level of at least about $6 \times 10^{15}$ neon atoms/cm$^2$ and at an energy level ranging from about 0.5 MeV to about 1.25 MeV; argon, implanted in said substrate at a dosage level of least about $2 \times 10^{15}$ argon atoms/cm$^2$ and at an energy level ranging from about 1.5 MeV to about 2.5 MeV; and krypton, implanted in said substrate at a dosage level of at least about $6 \times 10^{14}$ krypton atoms/cm$^2$ and at an energy level ranging from about 3 MeV to about 5 MeV; to inhibit recrystallization during subsequent annealing of said implant-damaged region of said silicon substrate containing said implanted atoms of said noble gas, said implanted noble gas atoms enmeshed in said isolation region with silicon atoms from said single crystal silicon substrate.

2. An integrated circuit structure formed in a surface of a single crystal silicon substrate over a buried non-oxide isolation region formed in said substrate beneath said substrate surface and spaced from said substrate surface, said isolation region comprising an implant-damaged region of said silicon substrate containing silicon atoms enmeshed with implanted noble gas atoms selected from the group consisting of neon, implanted in said substrate at a dosage level of at least about $6 \times 10^{15}$ neon atoms/cm$^2$ and at an energy level ranging from about 0.5 MeV to about 1.25 MeV; argon, implanted in said substrate at a dosage level of least about $2 \times 10^{15}$ argon atoms/cm$^2$ and at an energy level ranging from about 1.5 MeV to about 2.5 MeV; and krypton, implanted in said substrate at a dosage level of at least about $6 \times 10^{14}$ krypton atoms/cm$^2$ and at an energy level ranging from about 3 MeV to about 5 MeV; to inhibit recrystallization of said implant-damaged region of said silicon substrate containing said implanted atoms of said noble gas, upon subsequent annealing of said silicon substrate.

3. The structure of claim 2 which further includes oxide isolation located laterally adjacent said integrated circuit structure in said substrate and extending from said surface of said substrate down to said isolation region comprising said noble gas atoms enmeshed with said semiconductor atoms in said semiconductor substrate beneath said integrated circuit structure.

4. An integrated circuit structure in a single crystal silicon substrate electrically isolated from other portions of said silicon substrate by a buried non-oxide isolation region formed in said silicon substrate beneath said integrated circuit structure, said isolation region comprising an implant-damaged region of said silicon substrate containing implanted atoms of a noble gas implanted to a preselected depth in said silicon substrate beneath said substrate surface and beneath said integrated circuit structure, and at an implant dosage level sufficient to inhibit recrystallization of said implant-damaged region of said silicon substrate containing said implanted atoms of said noble gas during subsequent annealing, said implanted noble gas atoms enmeshed in said isolation region with silicon atoms from said single crystal silicon substrate.

5. The structure of claim 4 wherein said isolation region comprises noble gas atoms selected from the group consisting of neon, argon, krypton, and xenon atoms implanted into said substrate and then annealed to form said isolation region beneath said integrated circuit structure.

6. The structure of claim 5 wherein said noble gas atoms comprise neon atoms implanted in said substrate at a dosage level of at least about $6 \times 10^{15}$ neon atoms/cm$^2$ and at an energy level ranging from about 0.5 MeV to about 1.25 MeV.

7. The structure of claim 5 wherein said noble gas atoms comprise argon atoms implanted in said substrate at a dosage level of least about $2 \times 10^{15}$ argon atoms/cm$^2$ and at an energy level ranging from about 1.5 MeV to about 2.5 MeV.

8. The structure of claim 5 wherein said noble gas atoms comprise krypton atoms implanted in said substrate at a dosage level of at least about $6 \times 10^{14}$ krypton atoms/cm$^2$ and at an energy level ranging from about 3 MeV to about 5 MeV.

9. The structure of claim 5 wherein dielectric isolation located laterally adjacent said integrated circuit structure in said substrate extends down from the surface of said substrate to said isolation region.

10. The structure of claim 9 wherein said dielectric isolation laterally surrounds said integrated circuit structure in said semiconductor substrate.

11. The structure of claim 9 wherein said dielectric isolation comprises field oxide formed on said substrate.

12. The structure of claim 9 wherein said dielectric isolation comprises a dielectric material formed in a trench in said substrate.

* * * * *